United States Patent [19]
Lewis

[11] Patent Number: 5,917,147
[45] Date of Patent: *Jun. 29, 1999

[54] CLIP-ON NON-SNAG GROUNDING FINGER ARRAY

[75] Inventor: Jeffrey Michael Lewis, Maynard, Mass.

[73] Assignee: Digital Equipment Corporation, Maynard, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 08/593,101

[22] Filed: Jan. 30, 1996

[51] Int. Cl.$^6$ ...................................................... H05K 9/00
[52] U.S. Cl. ...................................................... 174/35 GC
[58] Field of Search ............................. 174/35 R, 35 GC, 174/51; 361/816, 818, 799, 800, 753, 759, 769, 787; 439/609, 92, 95

[56] References Cited

U.S. PATENT DOCUMENTS

| | | | |
|---|---|---|---|
| 3,904,810 | 9/1975 | Kraus | 174/35 MS |
| 4,322,572 | 3/1982 | Snyder | 174/35 R |
| 4,952,752 | 8/1990 | Roun | 174/35 R |
| 5,004,866 | 4/1991 | Cooke et al. | 174/34 GC |
| 5,015,802 | 5/1991 | Chi | 174/35 GC |
| 5,162,610 | 11/1992 | Clifton et al. | 174/35 R |
| 5,467,254 | 11/1995 | Brusati et al. | 361/799 |
| 5,513,996 | 5/1996 | Annerino et al. | 439/95 |
| 5,545,843 | 8/1996 | Arvidsson et al. | 174/35 GC |
| 5,576,513 | 11/1996 | Gunther et al. | 174/35 R |

*Primary Examiner*—Kristine Kincaid
*Assistant Examiner*—Hung V Ngo
*Attorney, Agent, or Firm*—Hamilton, Brook, Smith & Reynolds, P.C.

[57] ABSTRACT

A contact device includes a plurality of spring fingers on a conductive strip, each of the plurality of spring fingers having a cantilever spring portion, a locking tab, and a lead-in flange. The plurality of cantilever springs provide grounding contact to a removable cover when the plurality of locking tabs clip into a plurality of locking tab slots on the removable cover. Each lead-in flange has a lance-out tab. Every other of the plurality of lanced-out flanges clip into each of a plurality of lanced-out tab slots on the removable cover. Thus, after installation, the locking tab and the lead-in flange on each spring finger of the conductive strip provide for a clip-on, one-way positive-locking, non-snag, grounding contact with the cover of a base enclosure, furnishing an electromagnetic shield of electronic equipment within the base enclosure.

6 Claims, 4 Drawing Sheets

CLIP-ON NON-SNAG GROUNDING FINGER ARRAY

BACKGROUND OF THE INVENTION

This invention relates generally to computers, and more particularly to an apparatus that facilitates the installation or removal of a removable cover component of a computer enclosure.

As it is known in the art, computer systems typically have many components, such as disk storage or printers, which are normally encased within a metal enclosure, having detachable or removable covers. Many computer systems and peripherals require these removable covers to access internal components for servicing or upgrading purposes. These covers, which are usually part of the "outer skin" of the computer, however, are not shielded in and of themselves. The encased electronic components are capable of conducting electromagnetic signals inside the package, and electromagnetic signals can radiate and leak out from the detachable covers. Such electromagnetic emissions can significantly impact the performance of other proximate electronic components that are not within the enclosure, as well as protecting components within the enclosure from the emissions of the other proximate electronic components. Since the trend in computer systems is towards faster and higher frequency devices, and hence higher magnitudes of emissions, this degradation in performance is further magnified.

Thus, shielding of the critical inner components with a sealed enclosure of highly conductive material is necessary. One common response to this necessity in industry with these types of removable covers requires compliant spring fingers around the cover's perimeters to make grounding contact with the computer enclosure in order to "seal" in the electromagnetic emissions within the enclosure when operating. The spring finger is made of electrically conductive material and through the use of fingers around the edges of the cover or base enclosure, grounding contact is achieved via the fingers when the cover is installed. Typically, with modern computers, numerous contact points along the perimeter of the cover are required to accomplish this task.

Several basic problems arise in conventional computer systems, when providing removable covers with these spring fingers on contact points. Generally, the use of many spring fingers or strips of spring fingers require hardware or tools, such as a series of screws along the perimeter of the cover, to install. This type of installation, though arguably reliable, can be very impractical, costly and further, it can be very time consuming for the product operator or customer during removal/installation of the covers.

Another method of installation utilizing adhesive to mount the spring fingers leads to a familiar problem of unreliable long-term installation. Here, there is a tendency for the adhesive to dry out over time and lose its holding power. This predicament is especially magnified when the adhesive is used on covers which are frequently pulled on and off over a span of many years.

A still further potential deterrent with strips of spring fingers, is that they are easily snagged, susceptible to damage and deformation, and can be torn off or permanently distorted if the product assembler or customer is required to frequently handle or grip the edges of the cover where the fingers are mounted. Also, because strips are extremely thin and flexible, acute edges may produce risky conditions.

Another problem arises when the orientation at which the spring finger slides best over its mating contact surface is not consistent with the direction for cover installation or removal.

Additionally, in many cases, the spring fingers do not provide maximum compliance to provide a good grounding contact, while still providing for a cover that is easily installable or removable under a broad range of conditions. Notably, too much spring force will increase friction and make the cover difficult to remove or install.

One common solution to the above-mentioned types of problems, is to provide clip-on spring fingers on compliant strips This arrangement, however, is still subject to snagging when installing or removing, since the finger orientation is typically at a 90 degree axis to the sliding direction. Further, even if the ends of each spring finger were buried under the thickness of the cover flange, the protruding edges are still subject to snagging by the user or on imperfections along the mating contact surfaces of the computer enclosure.

Another solution for providing easy installation and non-snag features, is what is known in the prior art as the "wavy finger" strip. Because each finger is dependent on the adjacent finger for its deflection, this design has little compliance, or in other words, not all spring fingers are guaranteed to make contact with the mating surface of the computer enclosure. For instance, when a particular finger is deflected in a downward direction, the adjacent fingers may be deflecting upwards.

A still further solution to contact problems in the prior art is to provide individual spring fingers which clip into place and do not snag when installing or removing. However, being individual springs, installation is very time consuming and expensive. Also, with this type of design, the compliance is somewhat sensitive since the deflection force is similar to that of a simple beam with free ends, whereby the spring material must slide across the metal edges of the cover cutouts in order to deflect. Thus, this type of design produces a relatively stiff spring.

SUMMARY OF THE INVENTION

In accordance with the present invention, a contact device includes a longitudinal member and a plurality of spring fingers on the longitudinal member, each of the plurality of spring fingers including a cantilever spring portion and a locking tab portion. With such an arrangement, by having spring fingers with locking tab portions on a longitudinal member, a clip-on, non-snag, grounding finger array is provided.

In accordance with the present invention, a contact device includes a removable cover coupled to a cover flange having a plurality of lanced-out tab slots, a plurality of locking tab slots, and a plurality of spring fingers on a conductive strip. Each of the plurality of spring fingers include a cantilever spring portion with a locking tab. The contact device also includes a plurality of lead-in flanges and a plurality of lanced-out tabs coupled to the plurality of lead-in flanges, with alternating ones of the plurality of lanced-out tabs clipping into corresponding ones of a plurality of lanced-out tab slots and with the remaining of the plurality of lanced-out tabs bearing against a back side of the cover flange. With such an arrangement, by having locking tabs and lead-in flanges with lanced-out tabs where every other of the lanced-out tabs clips into the lanced-out tab slots, a clip-on, non-snag, grounding finger array is provided. That is, the spring fingers on the conductive strip clip into place and do not snag when installing onto the cover or cover removal from a base enclosure. Furthermore, a compliant design is provided such that all spring fingers make contact with such a base enclosure.

BRIEF DESCRIPTION OF THE DRAWINGS

The above-mentioned and other features of the invention will become more apparent by reference to the following description taken in connection with the accompanying drawings in which.

DESCRIPTION OF THE PREFERRED EMBODIMENT

As will now be described below, an embodiment of a spring finger array strip is shown having an arrangement that creates a non-snag, tabbed, compliant design not available in the prior art, while also maintaining easy installation and cover removal.

Figure 1:
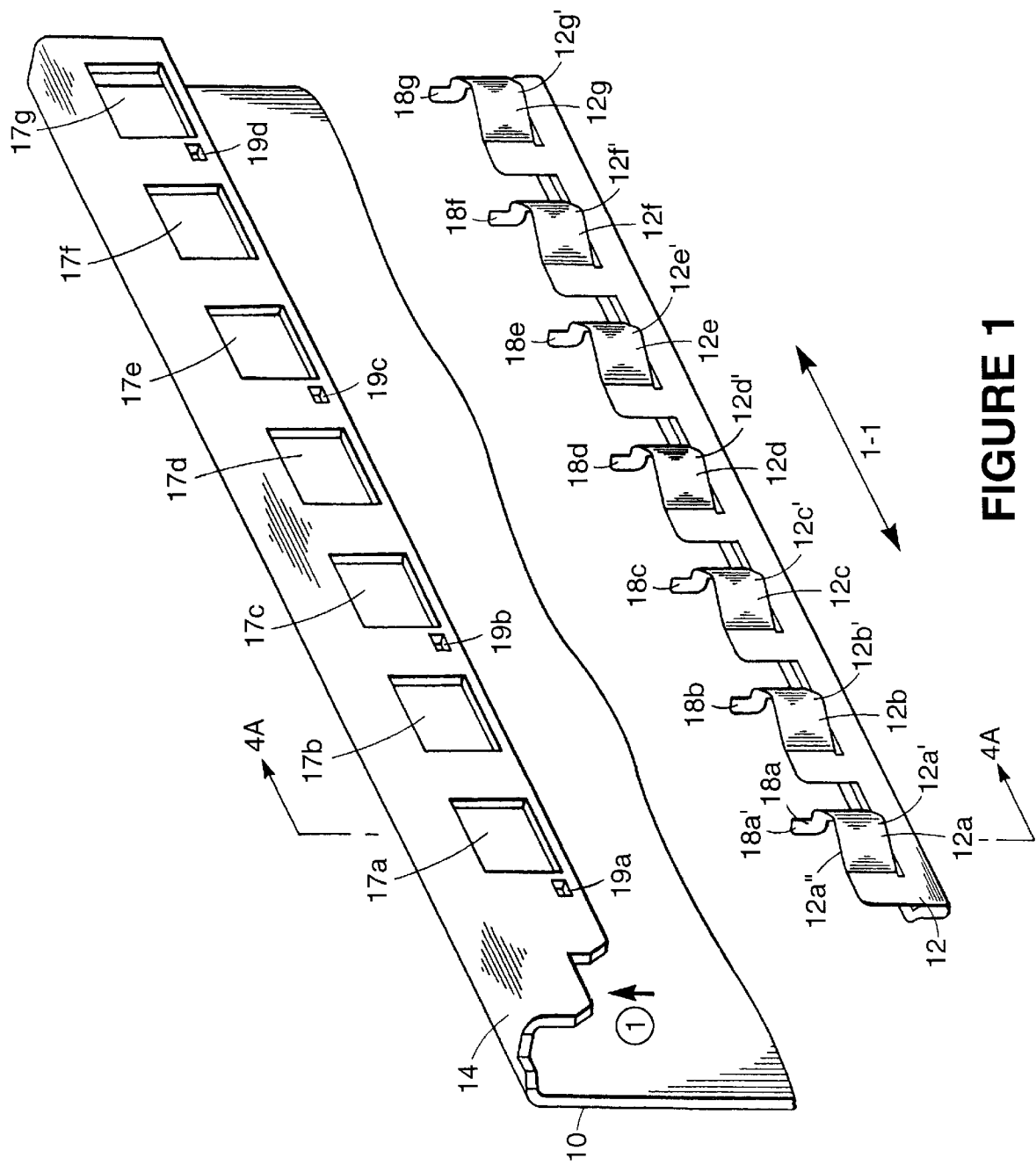
FIG. 1 is an isometric view of a portion of a cover for a computer enclosure with a cover flange showing locking tab slots and a spring finger array strip.

Referring now to FIG. 1, a removable computer cover 10 is shown to include a cover flange 14 and a spring finger array strip 12 used for installation. The cover flange 14 has a plurality of locking tab slots 17a–17g and a plurality of lanced-out tab slots 19a–19d. The spring finger array strip 12 has a plurality of individual spring fingers 12a–12g, each finger 12a–12g including an independent spring or cantilever portion, 12a'–12g'. This cantilever portion 12a'–12g' provides grounding contact points with a surrounding conductive enclosure. With such a configuration, none of the plurality of spring fingers 12a–12g are dependent on, or affected by, any other adjacent spring fingers 12a–12g. This provides a high degree of compliance against possible uneven surfaces.

The spring finger array strip 12 is further shown to include a plurality of locking tabs 18a–18g which extend outward from the end of each finger 12a–12g. For example, surface 18a' of locking tab 18a extends above surface 12a" of spring finger 12a, as shown in FIG. 1. The spring finger array strip 12 is, as indicated by arrow 1 in FIG. 1, attached with the cover flange 14 by an upward motion. The locking tabs 18a–18g slip through the locking slots 17a–17g and nest behind the back surface of the cover flange 14, keeping each finger 12a–12g securely engaged to the flange 14. (See FIG. 2). The opening provided by the locking tab slots 17a–17g allows the cantilever portions 12a'–12g' to deflect downward when grounding contact with a conductive enclosure has occurred. The locking tabs 18a–18g are also deflected downward into the locking tab slots 17a–17g when the cantilever portions 12a'–12g' are deflected downward. Thus, when the cover 10 is removed from the enclosure the cantilever spring portions 12a'–12g' spring upward and the locking tabs 18a–18g return to their original state nested against the back side of the cover flange 14. This feature prevents the snagging of the spring finger array strip 12 since the end of the spring 12a'–12g' of each finger 12a–12g will be secured in place by the locking tabs 18a–18g. The functionality of the lanced-out tab slots 19a–19d will be explained in further detail in conjunction with FIG. 3.

The apparatus shown in FIG. 1 is a seven-fingered strip 12 (i.e. seven spring fingers 12a–12g). This strip 12 can be manufactured such that it extends to any number of fingers desired which would reduce assembly time while still providing a compact, long-strip design. Furthermore, the dimensions of the fingers 12a–12g and the strip 12 can be altered to adapt to particular design requirements without jeopardizing the functionality of the present arrangement provided contact is established with the cover 10. Preferably, the spring finger array strip 12 is comprised of a metal material, such as stainless steel or beryllium copper. Typical dimensions of the spring finger array strip are as follows:

| Spring Finger Array & Cover | DIMENSIONS |
| --- | --- |
| Spring Finger Array Strip 12 | 13.8 cm |
| Spring Finger 12a | 1.2 cm |
| Locking Tab 18a | 0.5 cm × 2.0 mm |
| Locking Tab Slot 17a | 1.2 cm × 0.65 cm |
| Lanced-out Tab Slot 19a | 3.0 mm × 1.5 mm |
| Lead-in Flange 32a | 1.05 cm × 1.0 mm |
| Lanced-out Tab 34a | 2.0 mm × 1.0 mm |

Figure 2:
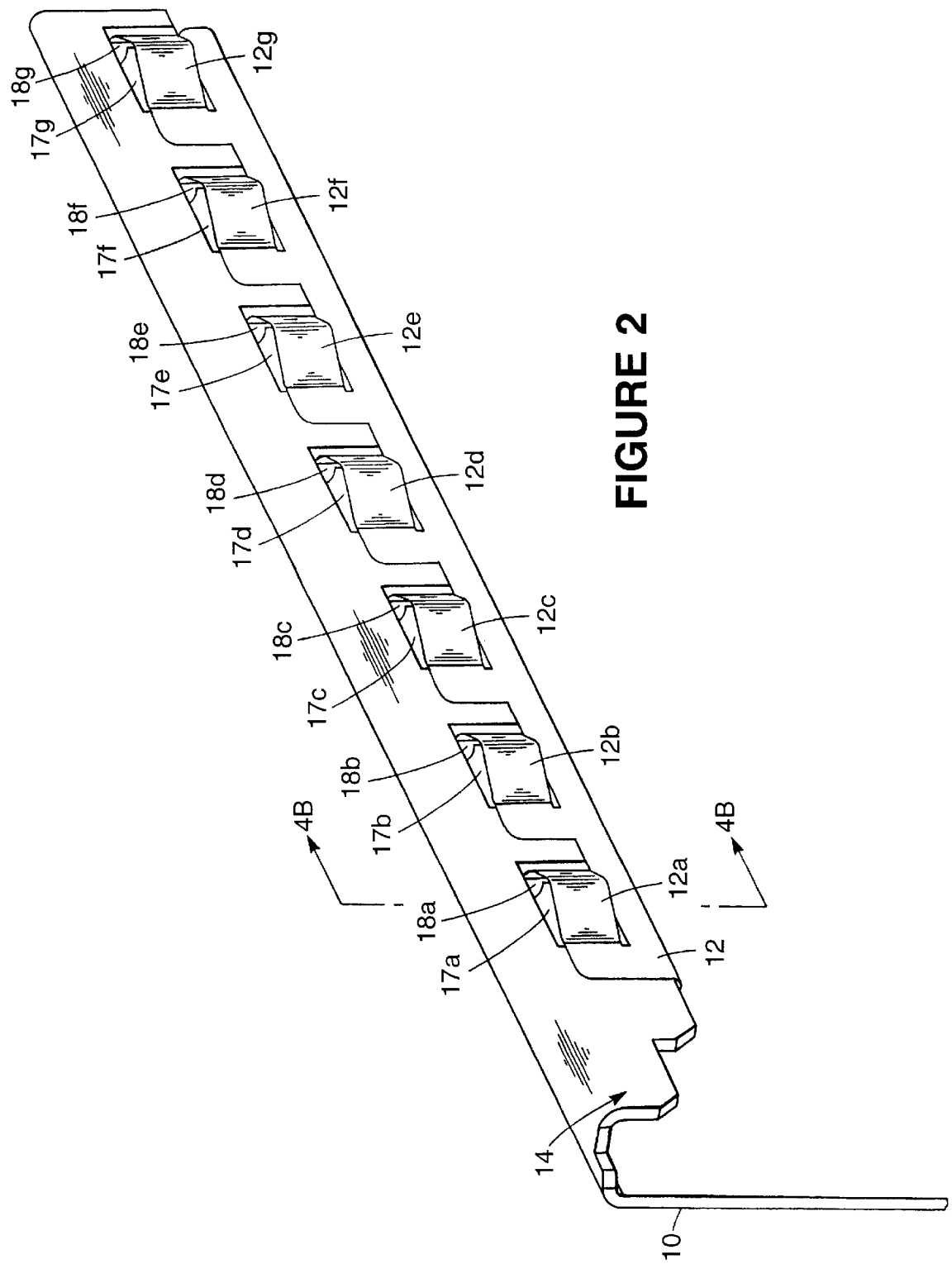
FIG. 2 is an isometric view of a portion of the cover in FIG. 1 with the spring finger array strip clipped into the locking tab slots.

Referring now to FIG. 2, the spring finger array strip 12 of FIG. 1 is shown in a locked position where the strip's locking tabs 18a–18g (FIG. 1) are inserted into slots 17a–17g (FIG. 1) of the cover flange 14. A cross-sectional view of this final captive position along line 4B—4B is shown in FIG. 4B. The spring fingers 12a–12g are oriented in the axis along the material edge consistent with the direction 1—1 (FIG. 1) of cover 10 removal and installation.

Figure 3:
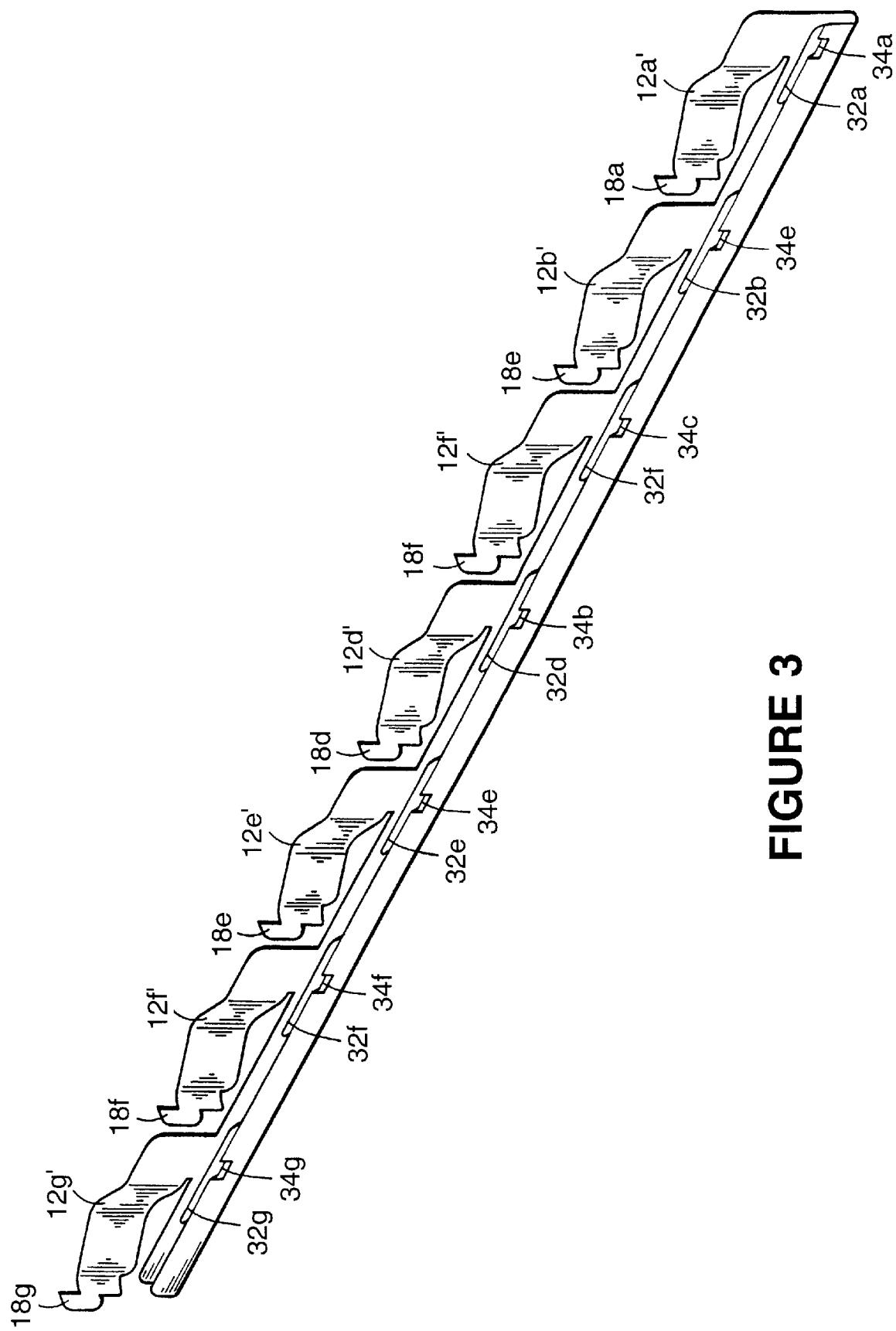
FIG. 3 is an isometric view of the backside of the spring finger array strip of FIG. 1.

Referring now to FIG. 3, the spring finger array strip 12 of FIG. 1 is further shown to include lead-in flanges 32a–32g which are angled for ease of installation onto the cover 10.

The lead-in flanges 32a–32g each contain lanced-out tabs 34a–34g. In the preferred embodiment of this invention, the lanced-out tabs 34a–34g provide a one-way, positive locking installation that can be easily snap-fitted to the cover flange 14. The lanced-out tabs 34a, 34c, 34e, and 34g clip into the lanced-out tab slots 19a–19d on the cover flange 14 locking the spring finger array strip 12 permanently in place. The lanced-out tabs 34b, 34d, and 34f do not lock into lanced-out tab slots 19a–19d, but bear tightly against the back side of the cover flange 14, further aiding in the non-snagging of the cover 10 upon removal. For instance, lanced-out tab 34a will clip into lanced-out tab slot 19a. Lanced-out tab 34b will not clip into a lanced-out tab slot as there is no slot in that position on the cover flange 14. Thus, lanced-out tab 34b serves the purpose of bearing tightly against the back side of the flange 14 to hold the strip 12 flush and snug to flange 14. Lanced-out tab 34c is paired with lanced-out tab slot 19b, lanced-out tab 34d is not paired with a lanced-out tab slot, lanced-out tab 34e is paired with lanced-out tab slot 19c, and so on.

Also shown in FIG. 3 from the back side, are the locking tabs 18a–18g and the cantilever spring portions 12a'–12g' of the spring finger array strip 12.

Figure 4A:
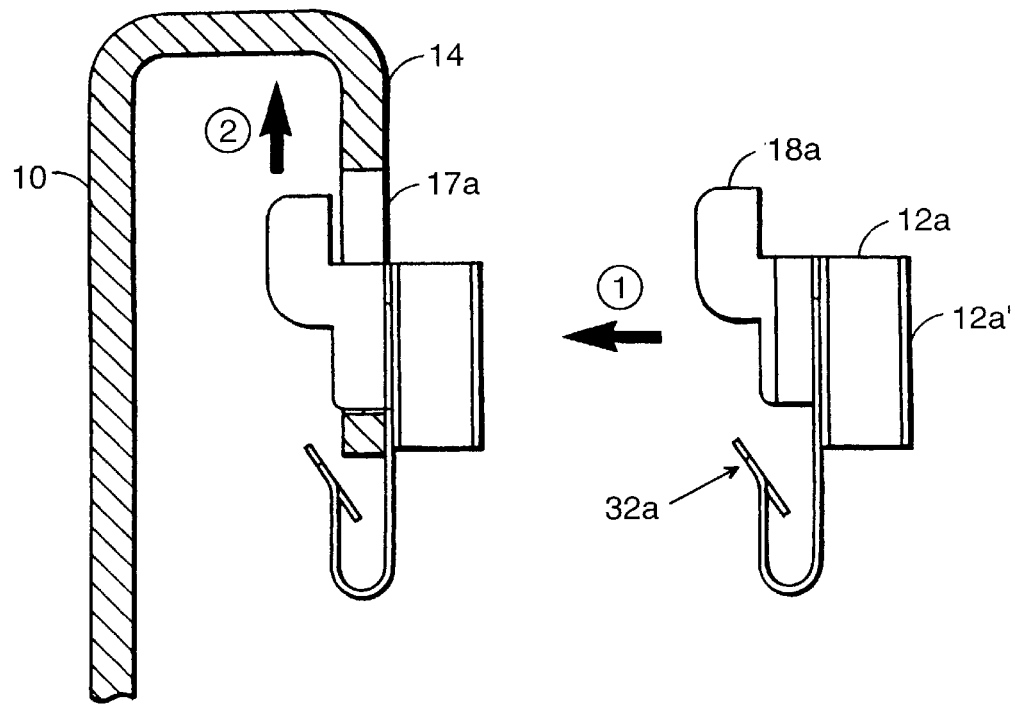
FIG. 4A is a cross-section view of the cover flange and the locking tab prior to installation.
Figure 4B:
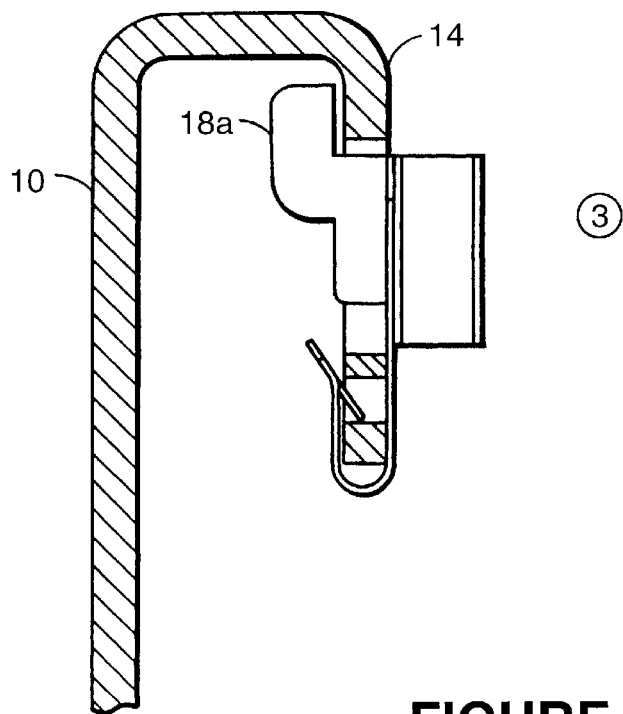
FIG. 4B is a cross-section view of the cover flange and the locking tab after installation.

Referring now to FIGS. 4A and 4B, a cross-section view of the cover flange 14 and the spring finger array strip 12 along the line 4A—4A of FIG. 1 and line 4B—4B of FIG. 2, respectively, are shown with the actions or movements to interconnect the spring finger array strip 12 with the cover flange 14 of the cover 10 as indicated by arrows.

Initially, referring to FIG. 4A, the spring finger array strip 12 shown with the locking tab 18a disposed perpendicular to locking tab slot 17a poised to enter into the cover flange 14. Step 1, marked by a left-pointing arrow, represents the horizontal movement of the spring finger array strip 12 towards the cover flange 14. Step 2, performed subsequent to Step 1 (the entrance of the locking tab 18a into the slot 17a), is marked by an upward arrow, representing the subsequent upward vertical force or motion required to nest the locking tab 18a into the corresponding locking tab slot 17a behind the cover flange 14.

FIG. 4B represents the cross-section view of the cover flange 14 and the spring finger array strip 12 after installation, or the result of Step 2 in FIG. 4A. After Steps 1 and 2 of FIG. 4A have been performed as discussed above, the spring finger array strip 12 is secured into the cover flange 14. Step 3 is a representation of the final captive position in conjunction with FIG. 2.

Having described preferred embodiments of the invention, it will now become apparent to those of skill in the art that other embodiments incorporating its concepts may be provided. It is felt, therefore, that this invention should not be limited to the disclosed embodiments, but rather should be limited only by the spirit and scope of the appended claims.

I claim:

1. A contact device comprising:

a longitudinal member;

a plurality of spring fingers on said longitudinal member, each of said plurality of spring fingers including a cantilever spring portion and a locking tab portion, wherein each of said plurality of locking tab portions nests behind a corresponding one of a plurality of locking tab slots on a removable cover; and wherein said longitudinal member further comprises a plurality of lead-in flanges and a plurality of lanced-out tabs coupled to said plurality of lead-in flanges, with alternating ones of said plurality of lanced-out tabs clipping into corresponding ones of a plurality of lanced-out tab slots on said removable cover, and with remaining ones of said plurality of lanced-out tabs bearing against a back side of said removable cover.

2. The contact device of claim 1 wherein said longitudinal member is made of a thin metal material.

3. The contact device of claim 1 wherein said removable cover covers electronic equipment in a base enclosure.

4. A contact device comprising:

a removable cover coupled to a cover flange having a plurality of lanced-out tab slots and a plurality of locking tab slots; and a plurality of spring fingers on a conductive strip, each of said plurality of spring fingers including a cantilever spring portion with a locking tab, each of said plurality of locking tabs securing into said plurality of locking tab slots on said cover flange;

a plurality of lead-in flanges on said conductive strip;

a plurality of lanced-out tabs coupled to said plurality of lead-in flanges, with alternating ones of said plurality of lanced-out tabs clipping into corresponding ones of said plurality of lanced-out tab slots, and with remaining ones of said plurality of lanced-out tabs bearing against a back side of said cover flange.

5. The contact device of claim 4 wherein said conductive strip is made of a thin metal material.

6. The contact device of claim 4 wherein said plurality of cantilever spring portions provide grounding contact on a base enclosure.

* * * * *